United States Patent [19]
Dibble et al.

[11] Patent Number: 6,040,631
[45] Date of Patent: Mar. 21, 2000

[54] METHOD OF IMPROVED CAVITY BGA CIRCUIT PACKAGE

[75] Inventors: Eric P. Dibble, Endicott; Eric A. Johnson, Greene; Raymond A. Phillips, Jr., Vestal, all of N.Y.

[73] Assignee: International Business Machines Corporation, Armonk, N.Y.

[21] Appl. No.: 09/238,872

[22] Filed: Jan. 27, 1999

[51] Int. Cl.[7] ............................. H01L 23/48; H01L 23/52; H01L 29/40

[52] U.S. Cl. ........................... 257/783; 257/712; 257/693; 257/793

[58] Field of Search ...................................... 257/783, 720, 257/712, 796, 675, 693, 678, 729, 793

[56] References Cited

U.S. PATENT DOCUMENTS

| | | | |
|---|---|---|---|
| 4,903,118 | 2/1990 | Iwada | 257/783 |
| 5,394,298 | 2/1995 | Sagisaka | 361/704 |
| 5,552,637 | 9/1996 | Yamagata | 257/783 |
| 5,629,835 | 5/1997 | Mahulikar et al. | 257/783 |
| 5,844,168 | 12/1998 | Schueller et al. | 257/693 |

*Primary Examiner*—Mahshid Saadat
*Assistant Examiner*—Jhihan B. Clark
*Attorney, Agent, or Firm*—William N. Hogg

[57] ABSTRACT

An improved bonding system is provided in which a metal heat spreader is bonded to semiconductor chip. A two adhesive system is used in which a first adhesive demonstrates high bond strength with a second adhesive exhibits high thermal conductivity.

13 Claims, 1 Drawing Sheet

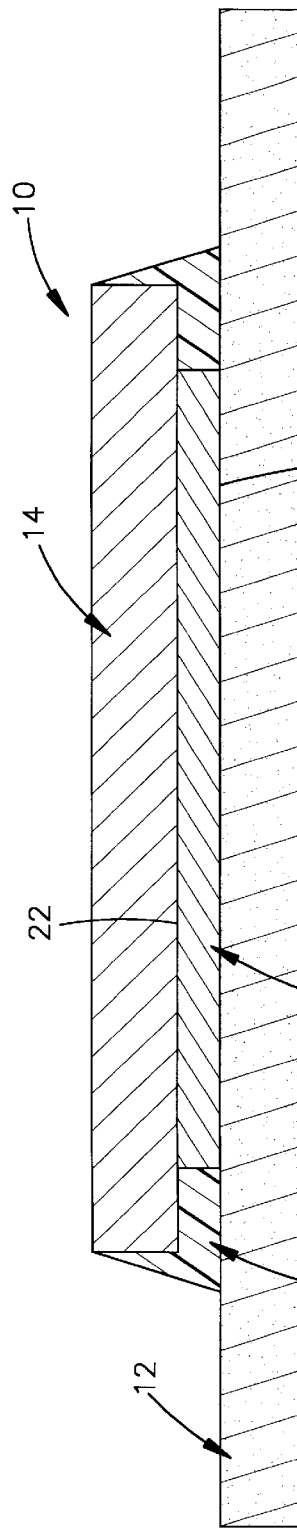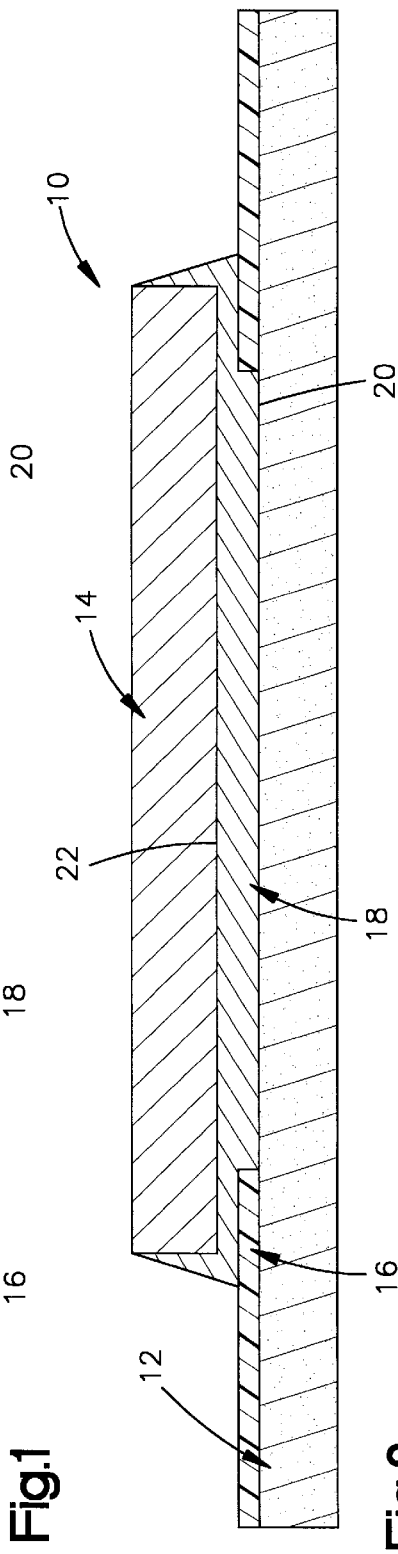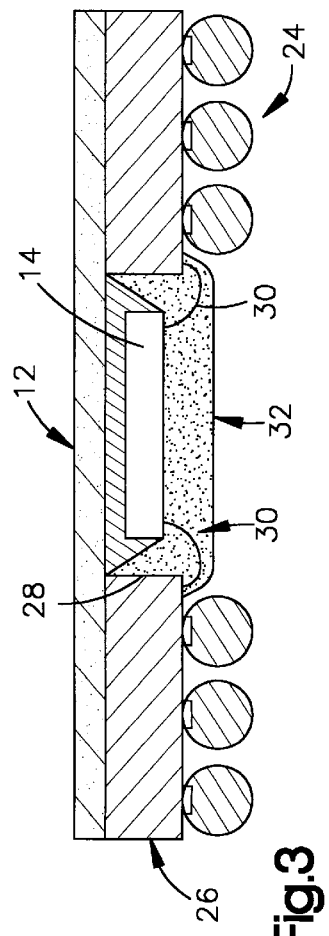

6,040,631

METHOD OF IMPROVED CAVITY BGA CIRCUIT PACKAGE

BACKGROUND OF THE INVENTION

The present invention generally relates to improving the thermal performance of chip to heat-spreader interconnections, specifically as used with ball grid arrays. As is known, modem integrated circuit packages often times include semiconductor chips bonded to a metal heat-spreader or sink. Typically, the metal heat-spreader is attached on or to a circuitized chip carrier made from an epoxy resin or other plastic. An opening in this circuitized carrier allows the back, or inactive, side of the chip to be bonded directly to the heat-spreader, typically with an epoxy. A glob of some other epoxy or resin is used to encapsulate the chip as well as any metal wires present for electrically connecting the chip to leads on the carrier.

The chip carrier/heat-spreader assembly can be provided with a ball grid array ("BGA"). As is known, a BGA allows a device to be connected to and communicate with other devices in an electronic system. Unlike dual-in-line packages, which use pins to connect a device to another circuit card, BGAs utilize an array of solder bumps to make this connection. Pin connections are difficult to make at the very high densities that are possible with BGAs. In addition, the circuit line length is shorter for BGAs than it is for pinned connections, which is of particular importance for SRAMs used as cache. Capacitance and the cost per I/O are other advantages of BGAs over PGAs.

Often, BGAs having their base made from plastic are chosen for applications in which thermal performance is important. Plastics are, generally, poor thermal conductors. To improve the cooling in a chip PBGAs may have a cavity that allows a chip to be mounted in a "chip down" orientation. This "chip down" orientation of a BGA provides for a direct connection of a chip/BGA assembly to a heat-spreader which as part of this direct connection is adhered to a top side of the carrier which holds the chip. Often, the heat-spreader may serve as the device's only heat dissipation element, but a heat-sink can be attached to the heat-spreader for enhanced performance.

In order to securely bond the chip to the metal heat-spreader an adhesive is used. Since the function of the metal heat-spreader is to dissipate heat generated by the operation of the chip this adhesive needs to possess a high thermal conductivity. The adhesive also must exhibit a high bond strength to the metal of the heat-spreader.

An adhesive must then exhibit the following properties: 1) good thermal conductivity; 2) good chip-to-adhesive bond strength and 3) good metal-to-adhesive strength. Comparatively few adhesives exist which exhibit each of these properties to the desired degree. With the trend for larger chips, both in terms of size as well as power consumed, these requirements become increasingly severe. Thus, the selection of a single adhesive to meet all of these requirements becomes very difficult.

Adhesives demonstrating high thermal conductivity are highly filled and generally provide poor mechanical adhesion between the chip and the heat-spreader. Moreover, heat-spreaders are typically made from copper that may have been plated with another metal or may have been treated with chloride to preserve its surface finish. These surface treatments often reduce the strength of the interfacial bond to the adhesive. To mitigate the resultant reduction in adhesions an additional layer of adhesive having better adhesion properties can be added. This added adhesive layer invariably increases the thermal resistance of the bond both by increasing the total bond thickness and by the additional interfacial resistance.

Accordingly, there is a need for a new and improved bonding system to be used with cavity BGA's that can accommodate higher stresses, without significantly increasing the package's thermal resistance, while being simple and inexpensive to produce.

SUMMARY OF THE INVENTION

In accordance with the present invention, an improved bonding system is provided for bonding a metal heat-spreader to a semiconductor chip in which the bond formed demonstrates both strong mechanical integrity of the chip attachment and bond interfaces while improving the thermal performance of the bond. Since a single adhesive cannot always be optimized to adhere to two different surfaces and still provide both high thermal conductivity and increased bonding strength a two adhesive system is used in which each possesses unique properties and is applied in a manner to avoid the traditional adhesive problems. In one embodiment of the present invention, a first adhesive possessing lower thermal conductivity but higher mechanical bond strength is adhered to regions of high interfacial stresses between a chip and a heat dissipating element such as a heat-spreader. A second adhesive demonstrating higher thermal conductivity but lower bond strength is adhered to the remaining connection surface area of the chip.

Thus, in one embodiment, a portion of the connection surface of the heat-spreader is coated with a first adhesive which provides strong bonding. A second portion of this connection surface which will be disposed directly adjacent to the chip is left uncovered by this first adhesive. At this second portion of the heat-spreader, a second adhesive which allows for increased thermal conductivity is applied. When the chip is attached to the heat-spreader, part of the chip's connection surface adheres to the first adhesive while the remainder of the chip adheres to the second adhesive. Thus, a chip and heat-spreader connection interface can be established in which a portion of the interface demonstrates increased bond strength and flexibility while the second adhesive provides improved thermal conductivity from the chip to the spreader.

BRIEF DESCRIPTION OF THE DRAWINGS

FIG. 1 illustrates a cross-sectional schematic of a first embodiment of the present invention;

FIG. 2 illustrates a cross-sectional schematic of a second embodiment of the present invention; and FIG. 3 illustrates a cross-sectional schematic of an embodiment of the present invention in which a chip is carried by a cavity ball grid array.

DETAILED DESCRIPTION

The present invention provides an improved interconnection between a heat-spreader and one or more chips specifically in the use and formation of integrated circuit packages having ball grid array interconnections. The present invention provides for adhering a chip to a heat-spreader in which two adhesives are used resulting in both good adhesion strength and low thermal resistance. In particular, the adhesives are applied to the connection surface of the heat-spreader so that a portion of a connection surface of the chip is in contact with, and adheres to, a lower conductivity adhesive while another portion of the connection surface of the chip is in contact with, and adheres to, a higher conductivity adhesive.

FIG. 1 illustrates an improved heat-spreader and chip assembly of the present invention shown generally at 10. A heat-spreader 12 is provided to dissipate heat produced during operation of a chip. Heat-spreader 12 is formed of a highly conductive metal such as copper but it is contemplated that other materials, known for high conductivity, could also be used. For instance, nickel or aluminum can also be used with the aluminum typically provided with a surface treatment such as an anodized or chromate-conversion later. As further seen in FIG. 1, a chip 14 is adhered to the heat-spreader.

During operation of chip 14, heat is generated. This heat must be dissipated from chip 14 in order for it to continue to function properly. While dissipating heat, chip 14 must still be securely bonded to heat-spreader 12. Otherwise, the bond formed between the chip and the heat-spreader will crack, fatigue and ultimately fail. To achieve a bond which securely attaches the heat-spreader 12 and chip 14 together without reducing the conduction of heat, two adhesives are used and applied only to certain regions of the heat-spreader 12. A first adhesive 16 which demonstrates lower conductivity but higher bond strength is used. One such adhesive is Masterbond Supreme 10 AOHT which bonds preferentially to copper. Due to this high bond strength, delamination at the interface between the heat-spreader and first adhesive is significantly reduced, allowing for greater accommodation of interfacial stresses.

The second adhesive 18 is a highly conductive adhesive such as Ablebond 965-1L. This adhesive 18 and other highly filled epoxies will readily conduct heat generated during operation of chip 14 to heat-spreader 12. While the second adhesive 18 is noted for its thermal conductivity, this type of adhesive does not adhere to the metal heat-spreader 12 as well as the first adhesive 16. Thus, the first adhesive 16 is applied to provide a strong bond while the second adhesive 18 is applied to improve the thermal conductivity.

As seen in FIG. 1, the first and second adhesives are applied to a connection surface 20 of the heat-spreader so that both adhesives contact the heat-spreader 12 and the chip 14 of form an assembly which has both a strong bond and good thermal conductivity. To form the assembly, a connection surface 20 of the heat-spreader is coated with the first adhesive 16 except for an area onto which the second adhesive 18 is coated. In the embodiment of FIG. 1, the coating of the first adhesive 16 will surround the coating of the second adhesive 18. Thus, when adhering chip 14 to the heat-spreader 12, an outer rim portion of a connection surface 22 of chip 14 comes into contact and adheres with the first adhesive 16 while the remaining center portion of the connection surface 22 of chip 14 adheres to the area of the connection surface 20 of heat-spreader 12 coated with second adhesive 18.

As seen in FIG. 2, in another embodiment, first adhesive 16 is applied to a portion of the connection surface 20 of heat-spreader 14 leaving an inner portion of heat-spreader connection surface 20 uncoated to accommodate second adhesive 18. The connection area designated for the second adhesive is coated accordingly and chip 14 placed into contact with the adhesives. Second adhesive 18 is applied so that some of it either spills over onto the top of first adhesive 16 or is extruded onto the top surface of the first adhesive when chip 14 is positioned. Thus, in this embodiment, chip 14 is primarily in contact and adheres with the second adhesive 18 which in turn adheres to both heat-spreader 12 and a top surface of first adhesive 18.

FIG. 3 illustrates a specific use of the present invention. As seen in FIG. 3, improved interconnection of a heat-spreader to a chip is illustrated as used with a ball grid array with the adhesive layers omitted for clarity, but understanding that the adhesives are used as described above. Ball grid arrays ("BGAs") are a conventional surface-mount product. Often, BGAs are used for surface mounting of high bandwidth components. In applications where thermal performance is important, packages with a cavity 28 are used.

As best seen in FIG. 3, the BGA 24 is attached by conventional means to chip carrier 26. Chip carrier 26 can be a glass-epoxy such as FR4 or any other well known carrier material. Chip carrier 26 has a cavity therethrough so that a chip can be attached to a heat-spreader 12.

To form an improved cavity BGA assembly of the present invention, chip 14 is bonded to heat-spreader 12 in a manner as described above. The high strength first adhesive 16 (FIGS. 1 and 2) is bonded to a portion of the chip's connection surface with the high conductivity adhesive bonding to the remaining portion of the chip's connection surface. In this embodiment, heat-spreader 12 is a metal plate. Chip 14 is then wired to the chip carrier's printed circuit board by wire bonds 30 which can be encapsulated in a glob 32 of an encapsulant for protection. Thus, a BGA having improved thermal performance is provided for by the present invention.

Thermal adhesives useful for adhering semiconductor chips to heat sinks are well known and any such thermal adhesive can be used in accordance with the present invention for forming each of first adhesive 16 and second adhesive 18. Examples of well known thermal adhesives are the epoxy resins, acrylic resins and silicone resins. Typically, these resins are filled to a greater or lesser degree with heat conducting fillers such as silver, alumina, aluminum nitrate or other particles, fibers or composites for improving thermal conductivity. Of course, the adhesive of first adhesive 16 should be selected to exhibit an enhanced bonding strength to heat spreader 12, since this fosters improved overall bond strength between chip or die 14 and heat spreader 12, as mentioned above.

There is no particular requirement for the bonding strength or thermal conductivity of the adhesives selected for forming first adhesive 16 and second adhesive 18, since the conditions of interfacial stress and thermal loading encountered in a particular package design will vary depending on the nature and size of the chip and heat spreader to be bonded. What is important, however, is that second adhesive 18 is selected to exhibit an enhanced thermal conductivity relative to first adhesive 16, it being recognized that the bonding strength of second adhesive 18 will most probably be compromised because of this difference. Preferably, the thermal conductivity of second adhesive 18 is at least about 10%, more preferably at least about 25%, even more preferably at least about 50%, greater than the thermal conductivity of first adhesive 16.

Because two separate adhesive are used in accordance with the present invention, the first adhesive can be selected with less concern for thermal conductivity than would otherwise be the case. Similarly, the second adhesive can also be selected with less concern for bonding strength than would otherwise be the case. As a result, greater flexibility is possible in designing the specific adhesive system to be used in a particular application. This is because each adhesive system can be custom designed in terms of the geographical locations where the two different adhesives are applied to provide just the right amount of bonding strength, thereby allowing the thermal conductivity of the overall adhesive bond to be maximized. Furthermore, greater latitude is achieved in terms of choosing the adhesives to use in a particular application, because the two adhesives need not exhibit good bonding strength as well as good thermal conductivity, as in the case of prior art designs. This allows stronger and cheaper bonding systems to be developed than possible in the past.

In a preferred embodiment of the invention, the first adhesive and the second adhesive in a particular integrated circuit package are selected from the same resin family. By resin family is meant for example, epoxy, phenolics, polyamides, polyesters, acrylics, silicones, polyimides, etc.

In a more preferred embodiment, both the first adhesive and the second adhesive are formed from epoxy resin adhesives. Epoxy resin adhesives, particularly thermal epoxy resin adhesives (i.e. epoxy resin adhesives exhibiting high thermal conductivity) are well known in the art. Some of these adhesives are known as exhibiting high bond strength with respect to semiconductor chips, particularly those made from silicon, while other are known for exhibiting high bond strengths to metal. Any of these adhesives can be used in the present invention. Examples of suitable epoxy adhesives are: 965 Epoxy, 8213 Epoxy and 240 Epoxy. Epoxy 965 is a well-known silver metal-filled thermal epoxy resin available from Ablestik. Epoxy 8213 is a brominated epoxy creosol novalac resin exhibiting a high glass transition temperature and low moisture absorptivity which is optionally filled with copper powder for enhanced thermal conductivity and reduced coefficient of thermal expansion. Epoxy 240 is a thixotropic solvent-based epoxy novalac resin.

Although only a few embodiments of the present invention have been described these are not intended to restrict or in any way limit the scope of the appended claims to such details. Additional advantage and modifications may readily appear to those skilled in the art. Therefore, the invention, in its broadest aspects, is not limited to the specific details, the representative apparatus or illustrative examples shown and described. Accordingly, departures may be made from such details without departing from the spirit or scope of the applicant's general inventive concepts.

We claim:

1. An integrated circuit package comprising a semiconductor chip having a chip connection surface thereon, a metal heat spreader having a heat-spreader connection surface and an adhesive bond adhering said chip to said heat spreader, said bond comprising
    a first adhesive attached to a first portion of said chip connection surface and to a first portion of said heat spreader connection surface, and
    a second adhesive attached to a second portion of said chip connection surface and to a second portion of said heat spreader connection surface wherein said second adhesive exhibits higher thermal, conductivity than said first adhesive and lower bond strength than said first adhesive.

2. The package of claim 1 further comprising a carrier attached to said heat spreader having a cavity therethrough;
    a ball grid array attached to said chip carrier and having a cavity therethrough in communication with said carrier cavity to form a chip receiving cavity receiving said chip; and
    bonding pads attaching said chip to said chip carrier.

3. The package of claim 1 wherein said first adhesive layer is formed from an epoxy resin.

4. The package of claim 2 wherein said chip is further attached to said chip carrier by a glob of encapsulating material.

5. The package of claim 3 wherein said heat spreader is a contact pad carried on said carrier.

6. The package of claim 5 wherein said second adhesive layer is formed from an epoxy resin.

7. An integrated circuit package comprising a semiconductor chip, a metal heat spreader and a mass of adhesive therebetween, said mass of adhesive comprising a first adhesive and a second adhesive, said second adhesive having a higher thermal conductivity and a lower bond strength than said first adhesive, said mass of adhesive defining a first region in which said first adhesive adheres said chip to said heat spreader and a second region in which said second adhesive adheres said chip to said heat spreader.

8. The package of claim 7, wherein the thermal conductivity of said second adhesive as at least 10% greater than the thermal conductivity of said first adhesive.

9. The package of claim 8, wherein the thermal conductivity of said second adhesive as at least 25% greater than the thermal conductivity of said first adhesive.

10. The package of claim 9, wherein the thermal conductivity of said second adhesive as at least 50% greater than the thermal conductivity of said first adhesive.

11. An integrated circuit package comprising a semiconductor chip having a chip connection surface thereon, a metal heat spreader having a heat-spreader connection surface and an adhesive bond adhering said chip to said heat spreader, said bond comprising:
    a first adhesive attached to a first portion of said chip connection surface and to a first portion of said heat spreader connection surface, and
    a second adhesive attached to a second portion of said chip connection surface or to a portion of said first adhesive and to a second portion of said heat spreader connection surface, wherein said first adhesive exhibits higher thermal conductivity than said second adhesive and lower bond strength than said second adhesive.

12. The invention as defined in claim 11 wherein said second adhesive is attached to said first adhesive resin.

13. The invention as defined in claim 11 wherein said second adhesive is attached to said second portion of said chip.

* * * * *